United States Patent
Tada (10) Patent No.: US 8,569,147 B2
(45) Date of Patent: Oct. 29, 2013

(54) SEMICONDUCTOR DEVICE AND MANUFACTURING METHOD THEREOF

(75) Inventor: Kenshi Tada, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 55 days.

(21) Appl. No.: 13/386,085

(22) PCT Filed: Jun. 8, 2010

(86) PCT No.: PCT/JP2010/003814
§ 371 (c)(1),
(2), (4) Date: Jan. 20, 2012

(87) PCT Pub. No.: WO2011/039907
PCT Pub. Date: Apr. 7, 2011

(65) Prior Publication Data
US 2012/0119322 A1 May 17, 2012

(30) Foreign Application Priority Data
Oct. 2, 2009 (JP) ................................ 2009-230768

(51) Int. Cl.
*H01L 21/30* (2006.01)
(52) U.S. Cl.
USPC ........................................ 438/458; 438/459
(58) Field of Classification Search
USPC ............................................... 438/458, 459
See application file for complete search history.

(56) References Cited

U.S. PATENT DOCUMENTS

| 5,882,987 | A  | * | 3/1999 | Srikrishnan ................... 438/458 |
| 6,191,007 | B1 |   | 2/2001 | Matsui et al. |
| 6,531,403 | B2 | * | 3/2003 | Ezaki ........................... 438/710 |

FOREIGN PATENT DOCUMENTS

| JP | 2-177435 A    | 7/1990  |
| JP | 4-307972 A    | 10/1992 |
| JP | 10-293320 A   | 11/1998 |
| JP | 11-97654 A    | 4/1999  |
| JP | 11-112000 A   | 4/1999  |
| JP | 2000-236095 A | 8/2000  |
| JP | 2000-340795 A | 12/2000 |
| JP | 2001-028354 A | 1/2001  |

OTHER PUBLICATIONS

Official Communication issued in International Patent Application No. PCT/JP2010/003814, mailed on Sep. 7, 2010.

* cited by examiner

*Primary Examiner* — Andy Huynh
(74) *Attorney, Agent, or Firm* — Keating & Bennett, LLP (57) ABSTRACT

A plurality of light-shielding films etc. are formed on a surface of a first insulating film. Then, a dummy pattern is formed on a surface of a second insulating film between adjoining ones of the light-shielding films etc., so that a height of the dummy pattern is equal to that of the second insulating film on the light-shielding films etc., as measured from the surface of the first insulating film. Thereafter, a third insulating film covering the dummy pattern and having a flat surface is formed over the surface of the second insulating film. Subsequently, a base layer is bonded to a support substrate so that the flat surface of the third insulating film faces the support substrate. A semiconductor device is manufactured in this manner.

9 Claims, 9 Drawing Sheets

SEMICONDUCTOR DEVICE AND MANUFACTURING METHOD THEREOF

TECHNICAL FIELD

The present invention relates to semiconductor devices for use in, e.g., liquid crystal display (LCD) devices, and manufacturing methods thereof.

BACKGROUND ART

For example, a LCD device includes: a TFT substrate having thin film transistors (TFTs) and pixel electrodes connected thereto are arranged in a matrix pattern; a counter substrate placed so as to face the TFT substrate and having a color filter, a common electrode, etc. formed thereon; and a liquid crystal layer interposed between the TFT substrate and the counter substrate.

A backlight unit as a light source is provided on the opposite side of the TFT substrate from the liquid crystal layer. A glass substrate is typically used as the TFT substrate. It is known to form over the TFT substrate a light-shielding film, which blocks incidence of light of the backlight unit on the TFTs, and a so-called back gate electrode.

Figure 22:
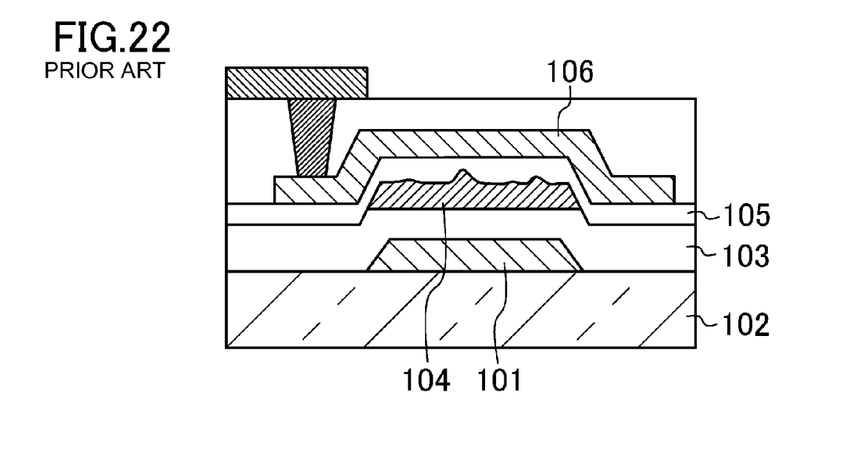
FIG. 22 is a cross-sectional view showing a main part of a conventional semiconductor device.

For example, as shown in FIG. 22, which is a cross-sectional view of a conventional semiconductor device, a light-shielding film 101 comprised of a so-called refractory metal is formed on a glass substrate 102. The light-shielding film 101 is covered by an insulating film 103. An island-shaped silicon layer 104 is formed on the surface of the insulating film 103 so as to overlap the light-shielding film 101. Moreover, a gate insulating film 105 is formed over the insulating film 103 so as to cover the silicon layer 104, and a gate electrode 106 is formed on the surface of the gate insulting film 105.

In this conventional semiconductor device, since the light-shielding film 101, the silicon layer 104, etc. are sequentially formed from the side of the glass substrate 102, the stepped shape of the light-shielding film 101 is reflected in the silicon layer 104. Accordingly, it is difficult to crystallize the silicon layer 104 with high accuracy by laser. Moreover, since the stepped portions of the light-shielding film 101, grain boundary ridges, etc. adversely affect the flatness of the surface of the silicon layer 104, it is difficult to form a thin gate insulating film 105. Thus, the threshold voltage of TFTs cannot be controlled with high accuracy, which increases the power supply voltage. Accordingly, it is difficult to reduce power consumption of the semiconductor device. Moreover, an increase in leakage current due to crystal defects in the semiconductor layer 104 results in increased power consumption.

As a solution to this problem, a substrate bonding method using monocrystalline silicon has been proposed as described below.

Figure 23:
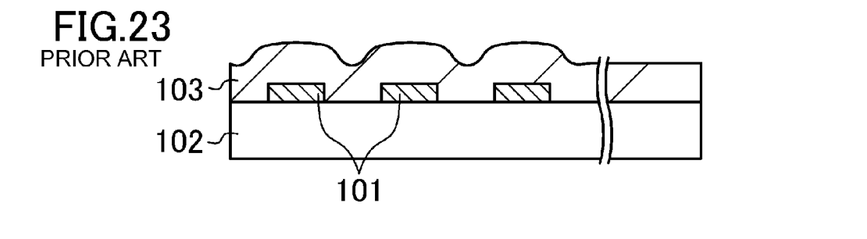
FIG. 23 is a cross-sectional view showing an insulating layer formed over a support substrate so as to cover light-shielding films in a conventional example.
Figure 24:
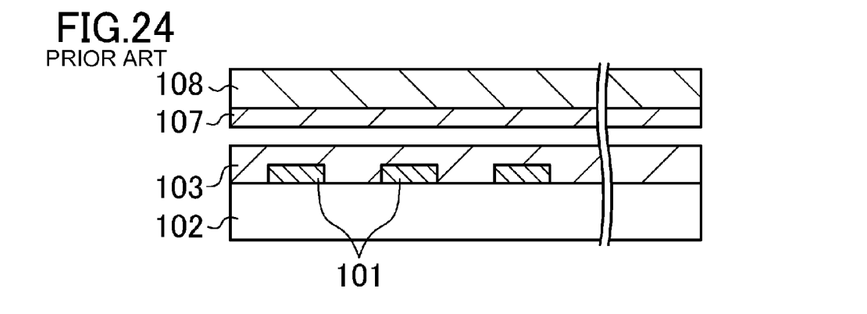
FIG. 24 is a cross-sectional view showing the support substrate having light-shielding films, and a silicon substrate facing the support substrate in the conventional example.
Figure 25:
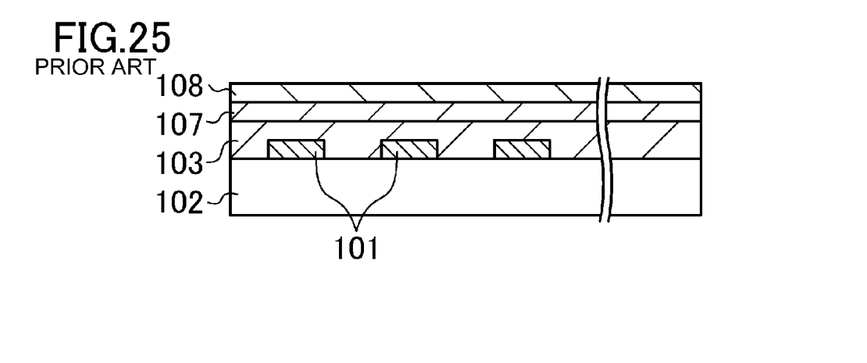
FIG. 25 is a cross-sectional vie showing a silicon layer reduced in thickness over the support substrate in the conventional example.

In a manufacturing method proposed in Patent Document 1, as shown in FIGS. 23-25, which are cross-sectional views illustrating a manufacturing process, a plurality of light-shielding films 101 and an insulating film 103 covering the light-shielding films 101 are first formed on a transparent support substrate 102. Next, as shown in FIG. 24, the surface of the insulating film 103 is planarized by a chemical mechanical polishing (CMP) method. Then, a buried oxide film 107 formed at the surface of monocrystalline silicon 108 is bonded to the planarized surface of the insulating film 103. Thereafter, as shown in FIG. 25, the monocrystalline silicon over the support substrate 102 is reduced in thickness, whereby TFTs are manufactured.

Figure 26:
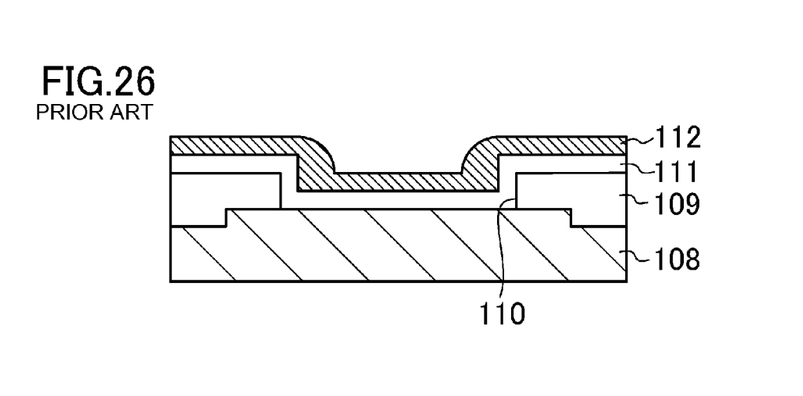
FIG. 26 is a cross-sectional view showing a back gate insulating film and a conductive material layer, both formed in an opening in an insulating film, in a conventional example.
Figure 27:
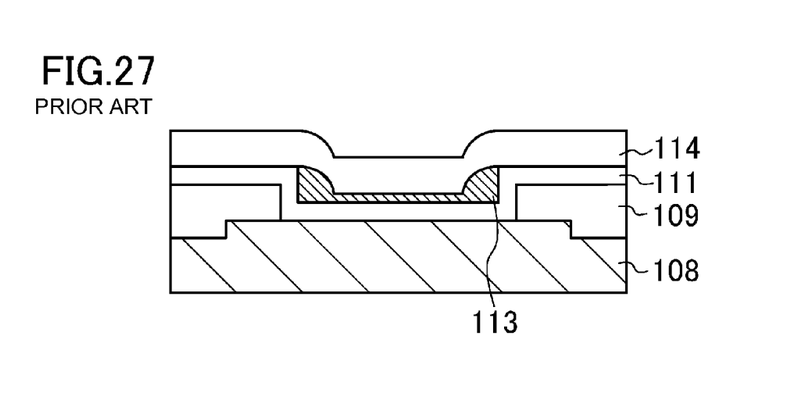
FIG. 27 is a cross-sectional view showing an interlayer insulating film covering a recessed back gate electrode in the conventional example.

In a manufacturing method proposed in Patent Document 2, as shown in FIGS. 26-27, which are cross-sectional views illustrating a manufacturing process, a silicon substrate 108 is formed so as to have an uneven surface, and the uneven surface is covered by an insulating film 109. Then, an opening 110 is formed in the insulating film 109 in a protruding region of the silicon substrate 108. Thereafter, a back gate insulating film 111 and a conductive material layer 112 are formed on the entire surface of the insulating film 109 including the opening 110, and then the conductive material layer 112 is polished. A back gate electrode 113 is formed by the conductive material layer 112 remaining in the opening 110. Subsequently, an interlayer insulating film 114 is formed so as to cover the back gate electrode 113 and the back gate insulating film 111, and the surface of the interlayer insulating film 114 is bonded to a support substrate (not shown).

CITATION LIST

Patent Document

PATENT DOCUMENT 1: Japanese Patent Publication No. H10-293320

PATENT DOCUMENT 2: Japanese Patent Publication No. 2001-28354

SUMMARY OF THE INVENTION

Technical Problem

In the case where the support substrate, namely the glass substrate 102, forms, e.g., a display panel of an LCD device, the support substrate is a large-size substrate. It is therefore very difficult to polish with high accuracy the insulating film 103 formed on the large-size support substrate by a CMP method as in Patent Document 1. This problem is significant because in recent years, the size of glass substrates has been increased in order to increase the number of display panels that can be fabricated from a single glass substrate.

In the manufacturing method of Patent Document 2, in the case where the overall dimension of the shape of the back gate electrode 113 is larger than that of the conductive material layer 112 that forms the back gate electrode 113, a recess reflecting the opening 110 may be formed in the surface of the conductive material layer 112, as shown in FIG. 27. This makes it very difficult to control the thickness of the back gate electrode 113. Since it is also difficult to planarize the bonding surface of the interlayer insulating film 111, the shape of the back gate electrode is limited.

The present invention was developed in view of the above problems, and it is a primary object of the present invention to enable an insulating layer covering light-shielding films etc. to be planarized with high accuracy regardless of the shape of the light-shielding films etc. in a semiconductor device in which the light-shielding films or back gate electrodes are formed.

Solution to the Problem

In order to achieve the above object, the present invention is directed to a method for manufacturing a semiconductor device. The method includes the steps of: forming on a surface of a base layer a first insulating film having a flat surface; ion implanting a delamination material into the base layer to form a delamination layer; forming a plurality of light-shielding films or back gate electrodes on the surface of the first insulating film; forming over the surface of the first insulating film a second insulating film that covers the light-shielding films or the back gate electrodes and that has an uneven surface reflecting a stepped shape of the light-shielding films or the back gate electrodes; forming a dummy pattern on the surface of the second insulating film between adjoining ones of the light-shielding films or between adjoining ones of the back gate electrodes, so that a height of the dummy pattern is equal to that of the second insulating film on the light-shielding films or the back gate electrodes, as measured from the surface of the first insulating film; forming over the surface of the second insulating film a third insulating film that covers the dummy pattern and that has a flat surface; bonding the base layer provided with the third insulating film to a support substrate so that the flat surface of the third insulating film faces the support substrate; separating and removing along the delamination layer a part of the base layer bonded to the support substrate; and forming, from the base layer remaining over the support substrate, a plurality of semiconductor layers forming semiconductor elements, so that at least a part of the semiconductor layer overlaps the light-shielding film or the back gate electrode.

The present invention is also directed to a semiconductor device. This semiconductor device includes: a third insulating film formed over a flat surface of a support substrate; a plurality of first recesses and a plurality of second recesses, which are alternately formed in a surface of the third insulating film; a dummy pattern provided in the first recess; a second insulating film formed over the surface of the third insulating film so as to cover the dummy pattern, so that a part of the second insulating film is provided in the second recesses; a plurality of third recesses formed in those regions of the second insulating film which overlap the second recesses; light-shielding layers or back gate electrodes provided in the third recesses; a first insulating film formed over a surface of the second insulating film so as to cover the light-shielding films or the back gate electrodes; a plurality of semiconductor layers forming semiconductor elements, and formed on a surface of the first insulating film so that the semiconductor layer overlaps at least a part of the light-shielding film or the back gate electrode, and a total thickness of the dummy pattern and the second insulating film overlapping the dummy pattern is equal to that of the light-shielding film or the back gate electrode and the second insulating film overlapping the light-shielding film or the back gate electrode.

Functions

Functions of the present invention will be described below.

In order to manufacture the above semiconductor device, a first insulating film having a flat surface is first formed on a surface of a base layer. Before forming the first insulating film, the surface of the base layer may be etched to form protruding regions. This allows semiconductor layers forming semiconductor elements to be formed from the protruding regions.

Next, a delamination material is ion implanted into the base layer to form a delamination layer. The step of forming the delamination layer is preferably performed before the step of forming light-shielding films or back gate electrodes. This allows the delamination layer to be formed at a uniform depth position because ion implantation is performed on a flat surface.

Then, a plurality of light-shielding films or back gate electrodes are formed on the surface of the first insulating film.

Thereafter, a second insulating film, which covers the light-shielding films or the back gate electrodes and has an uneven surface reflecting a stepped shape of the light-shielding films or the back gate electrodes, is formed over the surface of the first insulating film. The second insulating film may be comprised of a protective insulating film that suppresses passage of metal ions therethrough. For example, a silicon nitride film is preferable as the protective insulating film. This can hinder entrance of the metal ions from the side of a support substrate, and can reduce the possibility of variation in characteristics of the semiconductor elements.

Then, a dummy pattern is formed on the surface of the second insulating film between adjoining ones of the light-shielding films or between adjoining ones of the back gate electrodes, so that a height of the dummy pattern is equal to that of the second insulating film on the light-shielding films or the back gate electrodes, as measured from the surface of the first insulating film.

At this time, using the second insulating film as an etch stopper allows the dummy pattern to be easily formed with high accuracy.

Subsequently, a third insulating film, which covers the dummy pattern and has a flat surface, is formed over the surface of the second insulating film.

The third insulating film may be formed by forming an insulating material layer over the surface of the second insulating film, and then planarizing a surface of the insulating material layer. At this time, it is preferable that an interval between the light-shielding film or the back gate electrode and the dummy pattern be larger than a thickness of the second insulating film, and be smaller than a thickness of the insulating material layer over the light-shielding film or the back gate electrode.

Making the interval between the light-shielding film etc. and the dummy pattern larger than the thickness of the second insulating film allows the dummy pattern to be formed without extending on the tilted second insulating film covering the light-shielding film etc. Moreover, making the interval between the light-shielding film etc. and the dummy pattern smaller than the thickness of the insulating material layer reduces the possibility of formation of large recesses in the surface of the insulating material layer in a region between the dummy pattern and the light-shielding film etc. Thus, the surface of the insulating material layer can be easily planarized.

Then, the base layer provided with the third insulating film is bonded to the support substrate so that the flat surface of the third insulating film faces the support substrate. Thereafter, a part of the base layer bonded to the support substrate is separated and removed along the delamination layer.

Subsequently, a plurality of semiconductor layers forming semiconductor elements are formed from the base layer remaining over the support substrate, so that at least a part of the semiconductor layer overlaps the light-shielding film or the back gate electrode.

In the case where the protruding regions are not formed in advance by etching the base layer before forming the first insulating film as described above, the protruding regions may be formed in the above step by etching the base layer remaining over the support substrate. This allows the semiconductor layers to be formed from the protruding regions.

Advantages of the Invention

According to the present invention, the dummy pattern is formed on the surface of the second insulating film so that the height of the dummy pattern is equal to that of the second insulating film on the light-shielding films or the back gate electrodes, as measured from the surface of the first insulating film. This allows the insulating layer covering the light-shielding films etc. to be planarized with high accuracy regardless of the shape of the light-shielding films etc.

DESCRIPTION OF EMBODIMENTS

Embodiments of the present invention will be described in detail below with reference to the accompanying drawings. Note that the present invention is not limited to the following embodiments.

<First Embodiment>

FIGS. 1-10 show a first embodiment of the present invention.

Figure 1:
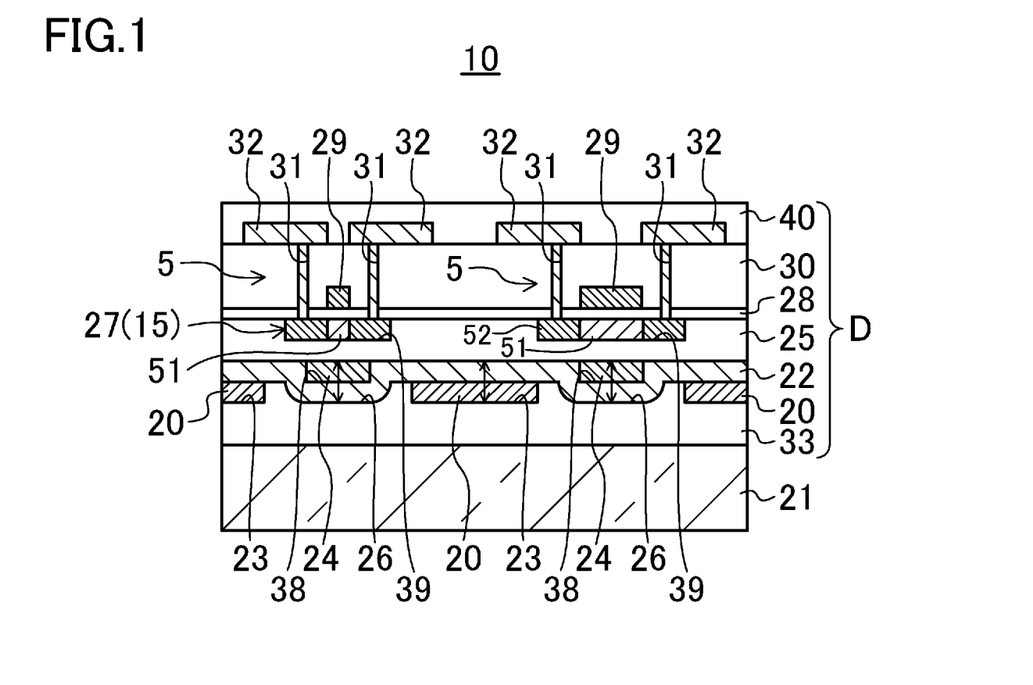
FIG. 1 is a cross-sectional view showing a main part of a semiconductor device according to a first embodiment.
Figure 10:
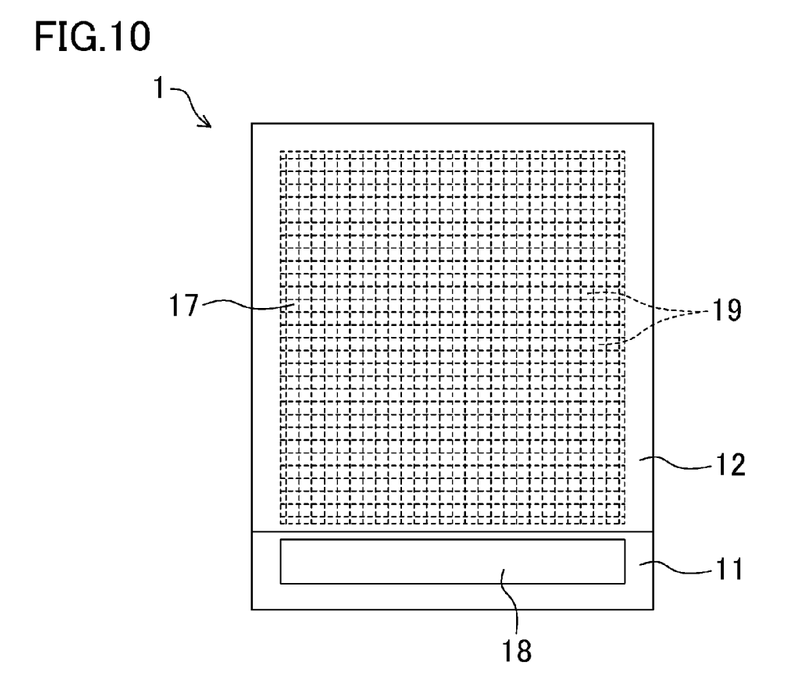
FIG. 10 is a plan view schematically showing a main part of an LCD device.

FIG. 1 is a cross-sectional view showing a main part of a semiconductor device 10 according to the first embodiment. FIG. 10 is a plan view schematically showing a main part of an LCD device 1.

Configuration of LCD Device

As shown in FIG. 10, the LCD device 1 includes a TFT substrate 11, a counter substrate 12 placed so as to face the TFT substrate 11, and a liquid crystal layer (not shown) interposed between the TFT substrate 11 and the counter substrate 12.

The LCD device 1 has a display area 17 in a region where the TFT substrate 11 overlaps the counter substrate 12. A plurality of pixels 19 are arranged in a matrix pattern in the display area 17.

The TFT substrate 11 is comprised of a glass substrate 21 as a transparent support substrate, and has a circuit area 18 in a region that does not overlap the counter substrate 12. In the circuit area 18, a circuit such as a driver for driving and controlling the pixels 19 is directly formed on the glass substrate 21 forming the TFT substrate 11. The drive in this circuit area 18 has TFTs 5 described below.

Although not shown in the figures, a TFT serving as a switching element and a pixel electrode connected thereto are provided for each pixel 19 in the TFT substrate 11. Gate lines and source lines are connected to the TFTs. The gate lines and the source lines are extended to the circuit area 18 so as to be connected to the driver etc. at their ends.

Although not shown in the figures, the counter substrate 12 is comprised of a glass substrate as a transparent support substrate, and a color filter, a common electrode, etc. are formed on the surface of the counter substrate 12, which is located on the side of the TFT substrate 11. A backlight (not shown) as a light source is provided on the opposite side of the TFT substrate 11 from the counter substrate 12.

Configuration of Semiconductor Device

The semiconductor device in the present embodiment is applied as various functional circuits such as the driver directly formed on the glass substrate 21 forming the TFT substrate 11. As shown in FIG. 1, the semiconductor device 10 includes the glass substrate 21 as a support substrate, and a high-density element portion D formed with high accuracy on the glass substrate 21.

In the case where the semiconductor device 10 is used in transmissive LCD devices, a transparent substrate such as the glass substrate 21 is preferable as the support substrate 21.

However, in the case where the semiconductor device 10 is used in display devices other than the transmissive LCD devices etc., other substrates such as a monocrystalline silicon semiconductor substrate can be used as the support substrate.

The element portion D has a third insulating film 33 bonded to a flat surface of the glass substrate 21 by self-bonding, the TFTs 5 as semiconductor elements formed over the third insulating film 33, and light-shielding films 24 provided between the glass substrate 21 and the TFTs 5. The TFTs 5 are, e.g., P-channel metal oxide semiconductor (PMOS) transistors.

Note that the light-shielding films 24 or back gate electrodes may be formed between the glass substrate 21 and the TFTs 5. An example in which the light-shielding films 24 are formed is described in the present embodiment. Although two TFTs 5 are shown in FIG. 1, the type of devices that are formed is not limited to the TFTs. N-channel metal oxide semiconductor (NMOS) transistors and other elements such as bipolar transistors, capacitor elements described later, or diodes can be similarly used as the devices. The number of devices is not particularly limited.

The structure of the semiconductor device 10 will be described in detail below with reference to FIG. 1.

A plurality of first recesses 23 and a plurality of second recesses 26 are alternately formed in the opposite surface of the third insulating film 33 from the glass substrate 21. A dummy pattern 20, which is comprised of, e.g., a silicon oxide film etc., is provided in each of the first recesses 23. A second insulating film 22 is formed over the surface of the third insulating film 33 so as to cover the dummy patterns 20. That is, a part of the second insulating film 22 is provided in the second recesses 26.

The second insulating film 22 has a substantially constant thickness. Since the second insulating film 22 is formed along the second recesses 26, third recesses 38 are formed in those regions of the second insulating film 22 which overlap the second recesses 26, respectively.

The second insulating film 22 is comprised of a protective insulating film that suppresses passage of metal ions therethrough. That is, the second insulating film 22 is comprised of, e.g., a dense insulating film such as a silicon nitride film.

Thus, the total thickness of the dummy pattern 20 and the second insulating film 22 overlapping the dummy pattern 20 is equal to that of the light-shielding film 24 and the second insulating film 22 overlapping the light-shielding film 24.

The thickness of the third insulating film 33 from the flat surface of the glass substrate 21 is the same both in the regions below the first recesses 23 having the dummy pattern 20 therein, and in the regions below the second recesses 26 having the second insulating film 22 therein.

The light-shielding films 24 are provided in the third recesses 38. The surfaces of the light-shielding films 24 are flush with the surface of the second insulating film 22.

The light-shielding films 24 are comprised of, e.g., a refractory metal such as molybdenum (Mo), titanium nitride (TiN), or tungsten (W). The light-shielding films 24 may be configured to function also as back gate electrodes. In this case, characteristics of the TFTs 5 can be dynamically changed by adjusting the potential of the back gate electrodes.

A first insulating film 25 is formed over the surface of the second insulating film 22 so as to cover the light-shielding films 24. Fourth recesses 39 are formed in the opposite surface of the first insulating film 25 from the second insulating film 22 in those regions which overlap at least a part of the light-shielding film 24.

Semiconductor layers 27 are formed in the fourth recesses 39, and the surfaces of the semiconductor layers 27 are flush with the opposite surface of the first insulating film 25 from the second insulating film 22. Thus, the semiconductor layers 27 are formed in an island shape in the surface of the first insulating film 25. At least a part of each semiconductor layer 27 overlaps a corresponding one of the light-shielding films 24. It is preferable that at least a channel region 51 in each semiconductor layer 27 overlap a corresponding one of the light-shielding films 24. Each semiconductor layer 27 includes the channel region 51 and heavily doped impurity regions 52 formed on both sides (the left and right sides in the figure) of the channel region 51.

In the present embodiment, the semiconductor layers 27 are also referred to as the "base layer." The base layer 15 is comprised of, e.g., a monocrystalline silicon semiconductor layer etc. Note that the base layer 1 may be configured to include at least one selected from the group consisting of Group IV semiconductors, Group II-VI compound semiconductors, Group III-V compound semiconductors, Group IV-IV compound semiconductors, alloys containing homologous elements thereof, and oxide semiconductors, instead of the monocrystalline silicon semiconductor layer.

As described below, a part of the base layer 15 is separated and removed along a delamination layer 42, which is formed by ion implantation of a delamination material such as hydrogen. The thickness of the base layer 15 is reduced by separating and removing the part of the base layer 15 in this manner by a heat treatment.

The surfaces of the semiconductor layers 27 and the surface of the first insulating film 25 is directly covered by a gate insulating film 28. Gate electrodes 29 are formed on the surface of the gate insulating film 28 so as to overlap the channel regions 51 of the semiconductor layers 27.

An interlayer insulating film 30 is formed on the gate insulating film 28 so as to cover the gate electrodes 29. Contact holes 31 are formed so as to extend through the interlayer insulating film 30 at positions on the heavily doped impurity regions 52 of the semiconductor layers 27. Moreover, interconnect portions (that is, source lines and drain lines) 32 are formed on the surface of the interlayer insulating film 30 and inside the contact holes 31. A protective film 40 is formed over the surface of the interlayer insulating film 30 so as to cover the interconnect portions 32.

Manufacturing Method

A method for manufacturing the semiconductor device 10 will be described below with reference to FIGS. 1-9.

Figure 2:
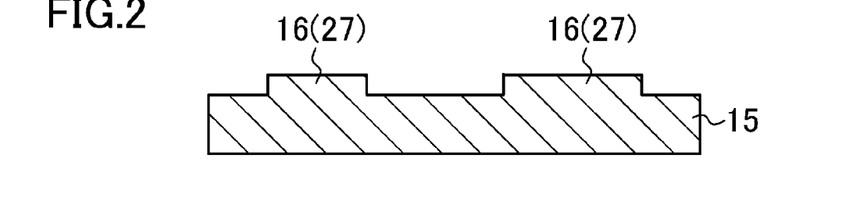
FIG. 2 is a cross-sectional view showing a base layer having protruding regions according to the first embodiment.
Figure 3:
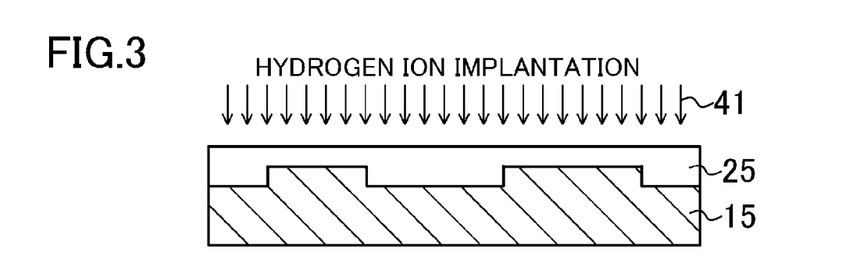
FIG. 3 is a cross-sectional view showing a state in which hydrogen ions are implanted into the base layer having a first insulating film according to the first embodiment.
Figure 4:
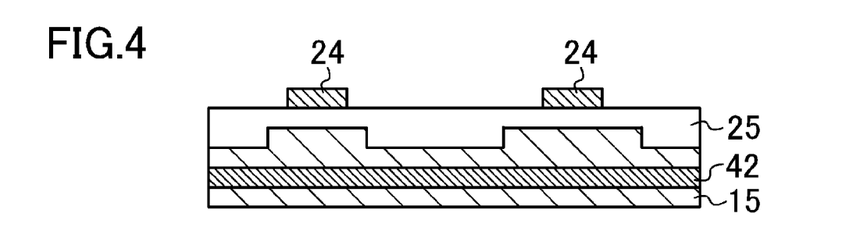
FIG. 4 is a cross-sectional view showing the base layer having a delamination layer and light-shielding films according to the first embodiment.
Figure 5:
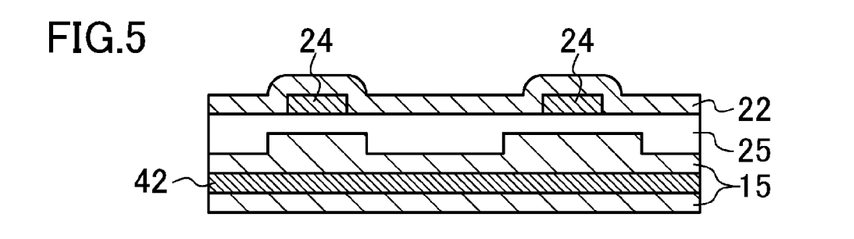
FIG. 5 is a cross-sectional view showing the base layer having a second insulating film covering the light-shielding films according to the first embodiment.

FIG. 2 is a cross-sectional view showing a base layer 15 having protruding regions 16. FIG. 3 is a cross-sectional view showing a state in which hydrogen ions are implanted into the base layer 15 having a first insulating film 25. FIG. 4 is a cross-sectional view showing the base layer 15 having a delamination layer 42 and light-shielding films 24. FIG. 5 is a cross-sectional view showing the base layer 15 having a second insulating film 22 covering the light-shielding films 24.

Figure 6:
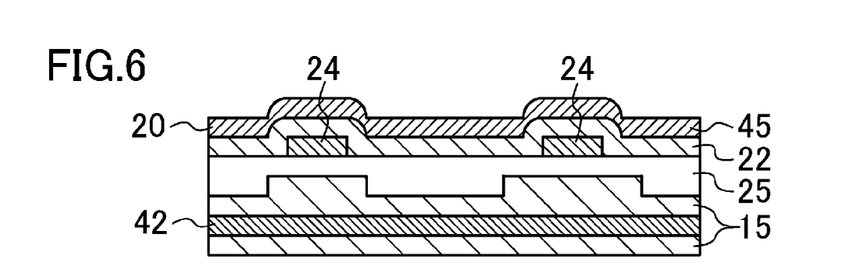
FIG. 6 is a cross-sectional view showing a silicon oxide film formed on the second insulating film according to the first embodiment.
Figure 7:
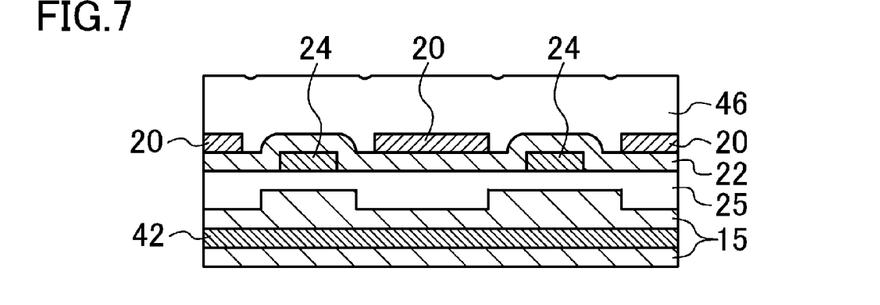
FIG. 7 is a cross-sectional view showing an insulating material layer covering dummy patterns according to the first embodiment.
Figure 8:
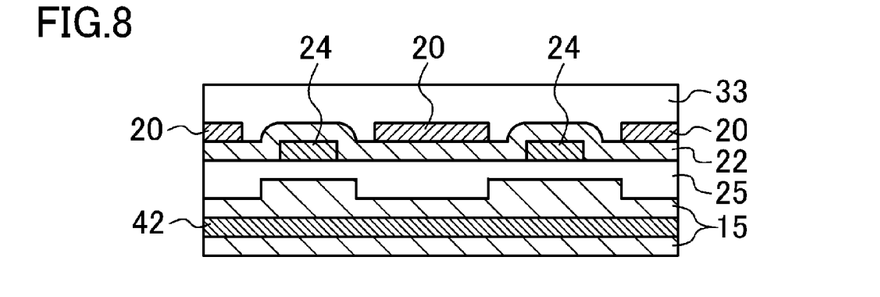
FIG. 8 is a cross-sectional view showing the base layer having a third insulating film according to the first embodiment.
Figure 9:
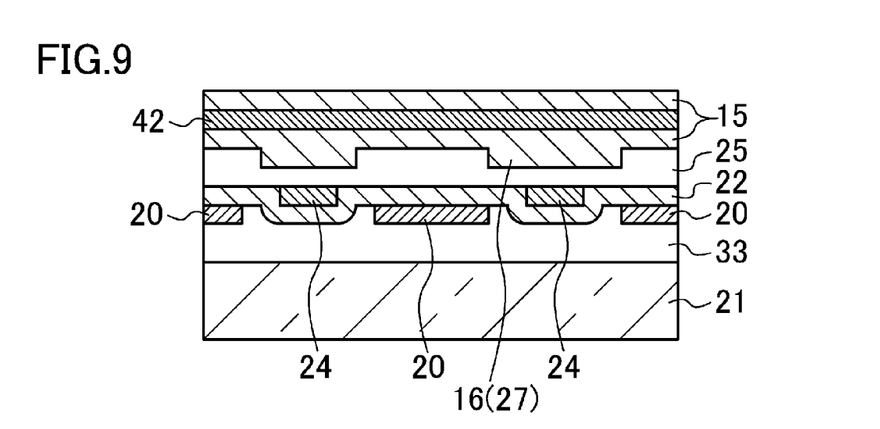
FIG. 9 is a cross-sectional view showing the base layer bonded to a glass substrate according to the first embodiment.

FIG. 6 is a cross-sectional view showing a silicon oxide film 45 formed on the second insulating film 22. FIG. 7 is a cross-sectional view showing an insulating material layer 46 covering dummy patterns 20. FIG. 8 is a cross-sectional view showing the base layer 15 having a third insulating film 33. FIG. 9 is a cross-sectional view showing the base layer 15 bonded to a glass substrate 21.

(Protruding Region Formation Step)

First, as shown in FIG. 2, the surface of a silicon wafer 15 as a base layer 15 is etched to form protruding regions 16 that will serve as semiconductor layers 27. The base layer 15 is a monocrystalline silicon layer.

(First Insulating Film Formation Step)

Next, as shown in FIG. 3, a first insulating film 25 having a flat surface is formed on the surface of the base layer 15. That is, an insulating film is formed so as to cover the protruding regions 16, and then the surface of the insulting film is planarized by a CMP method etc.

(Delamination Layer Formation Step)

Then, as shown in FIGS. 3-4, a delamination material 41 is ion implanted into the base layer 15 having the first insulating film 25 thereon, thereby forming a delaminating layer 42. For example, hydrogen is used as the delamination material 41. An inert element such as helium (He) or neon (Ne) may be used instead of hydrogen. Alternatively, both hydrogen and the inert element may be used. In the present embodiment, since the first insulating film 25 has a planarized surface, the delamination layer 42 can be formed at substantially a constant depth inside the base layer 15.

(Light-Shielding Film Formation Step)

Thereafter, as shown in FIG. 4, a plurality of light-shielding films 24 are formed on the surface of the first insulating film 25. Specifically, for example, a refractory metal layer such as Mo, TiN, or W is formed on the surface of the first insulating film 25, and then the refractory metal layer is etched by photolithography to form the light-shielding films 24. In this step, the light-shielding films 24 are formed so that each light-shielding film 24 overlaps at least a part of a corresponding one of the protruding regions 16. Note that in the case where back gate electrodes are formed instead of the light-shielding films 24, the back gate electrodes are formed in a similar manner in this step.

(Second Insulating Film Formation Step)

Subsequently, as shown in FIG. 5, a second insulating film 22 having an uneven surface reflecting the stepped shape of the light-shielding films 24 is formed over the surface of the first insulating film 25 so as to cover the light-shielding films 24. The second insulating film 22 is, e.g., a dense protective insulating film such as a silicon nitride film. The second insulating film 22 suppresses passage of metal ions therethrough.

(Dummy Pattern Formation Step)

Then, as shown in FIG. 7, a dummy pattern 20 is formed on the surface of the second insulating film 22 between adjoining ones of the light-shielding films 24. Specifically, as shown in FIG. 6, a silicon oxide film 45 as an insulating film is first formed on the entire surface of the second insulating film 22. The thickness of the silicon oxide film 45 is about the same as that of the light-shielding films 45.

Then, the silicon oxide film 45 formed on the surface of the second insulating film 22 is etched by using the second insulating film 22 as an etch stopper, thereby forming the dummy patterns 20 as shown in FIG. 7. Thus, the height of the dummy patterns 20 is the same as the surface height of the second insulating film 22 on the light-shielding films 24, based on the surface of the first insulating film 25, which is located on the side of the second insulating film 22.

(Third Insulating Film Formation Step)

Thereafter, as shown in FIG. 8, a third insulating film 33 having a flat surface is formed over the surface of the second insulating film 22 so as to cover the dummy patterns 20. Specifically, as shown in FIG. 7, an insulating material layer 46 is first formed over the surface of the second insulating film 22.

The interval between the light-shielding film 24 and the dummy pattern 20 (the interval in the direction parallel to the surface of the glass substrate 21) is larger than the thickness of the second insulating film 22, and is smaller than the thickness of the insulating material layer 46 over the light-shielding film 24. This reduces the possibility of formation of large recesses in the surface of the insulating material layer 46 in each region between the dummy pattern 20 and the light-shielding film 24.

Then, as shown in FIG. 8, the surface of the insulating material layer 46 is polished and planarized by a CMP method etc. to form the third insulating film 33.

(Bonding Step)

Thereafter, as shown in FIG. 9, the base layer 15 provided with the third insulating film 33 and having a part of the element portion D formed thereon is bonded to the glass substrate 21 as a support substrate so that the flat surface of the third insulating film 33 faces the glass substrate 21. At this time, the surface of the third insulating film 33 is bonded to the surface of the glass substrate 21 by self-bonding due to the van der Waals force.

(Separating Step)

Subsequently, a part of the base layer 15 bonded to the glass substrate 21 is separated and removed along the delamination layer 42. Specifically, the base layer 15 bonded to the glass substrate 21 is heated to about 400-600° C. to separate and remove along the delamination layer 42 a part of the base layer 15, which is located on the opposite side of the delamination layer 42 from the glass substrate 21.

(Semiconductor Layer Formation Step)

Then, the base layer 15 remaining over the glass substrate 21 is etched by using the first insulating film 25 around each protruding region 16 as an etch stopper, thereby forming semiconductor layers 27 forming TFTs as semiconductor elements. At this time, the semiconductor layers 27 are formed so that at least a part of each semiconductor layer 27 overlaps a corresponding one of the light-shielding films 24. As a result, only the protruding regions 16 of the base layer 15 are left in an island shape as the semiconductor layers 27.

(Gate Insulating Film Formation Step)

Thereafter, as shown in FIG. 1, a gate insulating film 28 is formed so as to cover the semiconductor layers 27. The gate insulating film 28 is formed to have a flat surface along the surfaces of the semiconductor layers 27 and the first insulating film 25.

(Gate Electrode Formation Step)

Then, as shown in FIG. 1, gate electrodes 29 are formed on the surface of the gate insulating film 28 so as to overlap channel regions 51 of the semiconductor layers 27.

(Heavily Doped Impurity Region Formation Step)

Subsequently, as shown in FIG. 1, at least a part of each semiconductor layer 27 is doped with an impurity element to form a heavily doped impurity region 52. The semiconductor layers 27 are doped with the impurity element by using the gate electrodes 29 as a mask. As a result, the heavily doped impurity region 52 is formed in a region of each semiconductor layer 27, which does not overlap a corresponding one of the gate electrodes 29, whereas the channel region 51 is formed in a region of each semiconductor layer 27, which overlaps a corresponding one of the gate electrodes 29.

Thereafter, contact holes 31 are formed in the interlayer insulating film 30 etc. Then, a metal layer formed on the interlayer insulating film 30 is patterned by photolithography to form a plurality of interconnect portions 32. The semiconductor device 1 is manufactured by the steps described above.

Advantages of First Embodiment

According to the first embodiment, the dummy patterns 20 are formed on the surface of the second insulating film 22 so that the height of the dummy patterns 20 is equal to that of the second insulating film 22 on the light-shielding films 24, as measured from the surface of the first insulating film 25. This allows the total thickness of the dummy pattern 20 and the second insulating film 22 overlapping the dummy pattern 20 to be equal to that of the light-shielding film 24 and the second insulating film 22 overlapping the light-shielding film 24, on the flat surface of the first insulating film 25. As a result, the third insulating film 33 covering the light-shielding films 24 can be planarized with high accuracy on the base layer 15 by a CMP method regardless of the shape of the light-shielding films 24. This makes it easier to perform the subsequent step of bonding the base layer 15 to the glass substrate 21, and also eliminates the need to perform the CMP treatment on the large-size glass substrate 21.

Moreover, the interval between the light-shielding film 24 and the dummy pattern 20 is larger than the thickness of the second insulating film 22, and is smaller than the thickness of the insulating material layer 46 over the light-shielding film 24. This allows the dummy patterns 20 to be formed without extending on the tilted second insulating film 22 covering the light-shielding films 24, and also reduces the possibility of formation of large recesses in the surface of the insulating material layer 46 in each region between the dummy pattern 20 and the light-shielding film 24. Thus, the surface of the insulating material layer 46 can be easily planarized with high accuracy.

Furthermore, the dummy patterns 20 are formed after forming the second insulating film 22 comprised of a dense protective insulating film such as a silicon nitride film. Accordingly, even if the glass substrate 21 is used as the support substrate, the second insulating film 22 suppresses passage of metal ions (mobile ions) therethrough from the side of the glass substrate 21, and the possibility of variation in characteristics of the TFTs 5 as semiconductor elements can be reduced. Moreover, since the second insulating film 22 can be used as an etch stopper, the dummy patterns 20 can be more easily formed with higher accuracy while reducing the possibility of corrosion of a lower layer such as the light-shielding films 24.

Moreover, since the dummy patterns 20 are comprised of a silicon oxide film, the possibility of an unnecessary increase in load capacitance can be reduced and reduction in aperture ratio of the LCD device 1 can be suppressed, as compared to the case where the dummy patterns 20 are comprised of a metal film.

In addition, since the delamination material 41 can be ion implanted into the base layer 15 before forming the light-shielding films 24, ions can be implanted to a uniform depth in the base layer 15, which allows the delamination layer 42 to be formed at a uniform depth position in the base layer 15.

Moreover, the light-shielding films 24 are formed in advance in the base layer 15 before bonding the base layer 15 to the glass substrate 21. This eliminates the need to align the light-shielding films with the semiconductor layers with high accuracy in the step of bonding the base layer to the glass substrate as in conventional examples, and also allows the desired regions of the semiconductor layers 27 to be more easily covered by the light-shielding films 24.

Forming new interconnect layers from the light-shielding films 24 can reduce the size of the circuit configuration that is formed in the glass substrate 21.

Moreover, bonding the base layer 15 to the glass substrate 21 can facilitate formation of flat semiconductor layers 27.

Since the semiconductor layers 27 do not have a stepped shape, the thickness of the gate insulating film 28 can be easily reduced. This allows the threshold voltage in the semiconductor layers 27 to be controlled with high accuracy, and thus can reduce power consumption of the semiconductor device 10.

Moreover, since the semiconductor layers 27 are comprised of monocrystalline silicon, the possibility of a leakage current due to crystal defects can be reduced. This can significantly improve characteristics of the TFTs 5 having the semiconductor layers 27.

<Second Embodiment>

FIGS. 11-19 show a second embodiment of the present invention.

Figure 11:
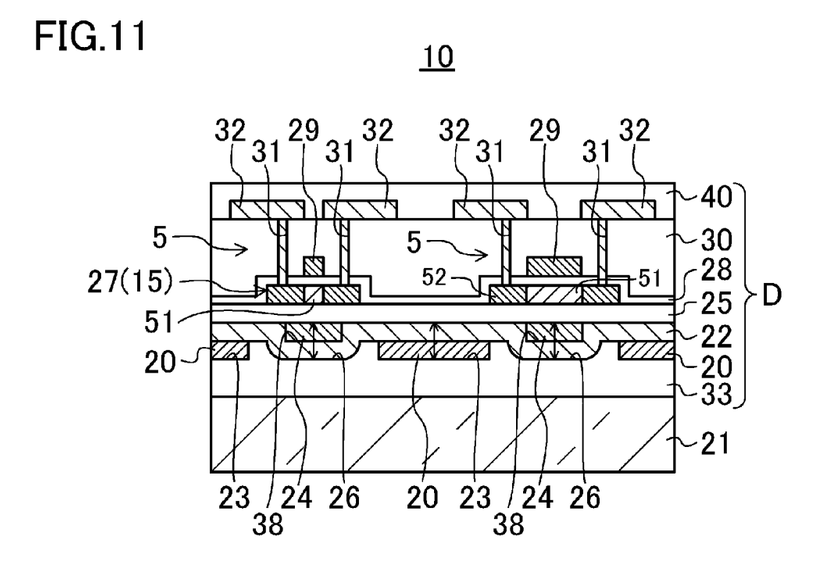
FIG. 11 is a cross-sectional view showing a main part of a semiconductor device according to a second embodiment.

FIG. 11 is a cross-sectional view showing a main part of a semiconductor device 10 according to the second embodiment. Note that in the following embodiments, the same portions as those in FIGS. 1-10 are denoted with the same reference characters, and detailed description thereof will be omitted.

In the first embodiment, the semiconductor layers 27 are formed in the fourth recesses 39 in the first insulating film 25. In the second embodiment, however, semiconductor layers 27 are formed on a flat surface of a first insulating film 25.

Configuration of Semiconductor Device

As in the first embodiment, in the semiconductor device 10, the total thickness of the dummy pattern 20 and the second insulating film 22 overlapping the dummy pattern 20 is equal to that of the light-shielding film 24 and the second insulating film 22 overlapping the light-shielding film 24.

Unlike the first embodiment, the first insulating film 25 provided on the surfaces of the light-shielding films 24 and the surface of the second insulating film 22 has a flat surface. The semiconductor layers 27 are formed in an island shape on the flat surface of the first insulating film 25. The gate insulating film 28 covers the semiconductor layers 27, and has a convex surface in those regions where the gate insulating film 28 covers the semiconductor layers 27.

Manufacturing Method

A method for manufacturing the semiconductor device 10 will be described below with reference to FIGS. 12-19.

Figure 12:
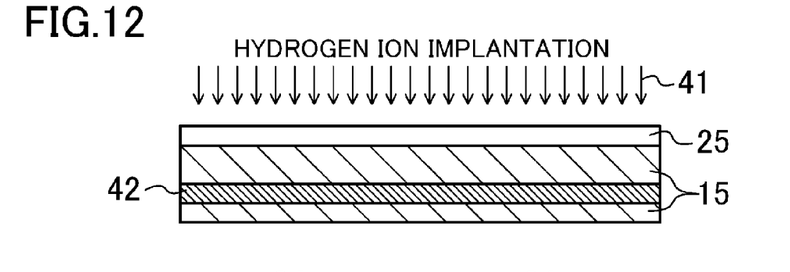
FIG. 12 is a cross-sectional view showing a base layer having a delamination film according to the second embodiment.
Figure 13:
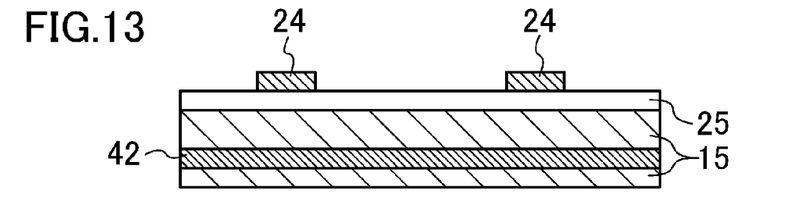
FIG. 13 is a cross-sectional view showing the base layer having light-shielding films according to the second embodiment.
Figure 14:
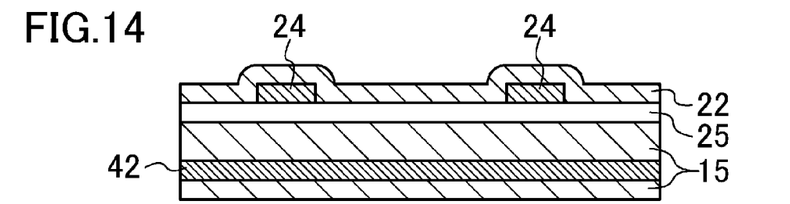
FIG. 14 is a cross-sectional view showing the base layer having a second insulating film covering the light-shielding films according to the second embodiment.
Figure 15:
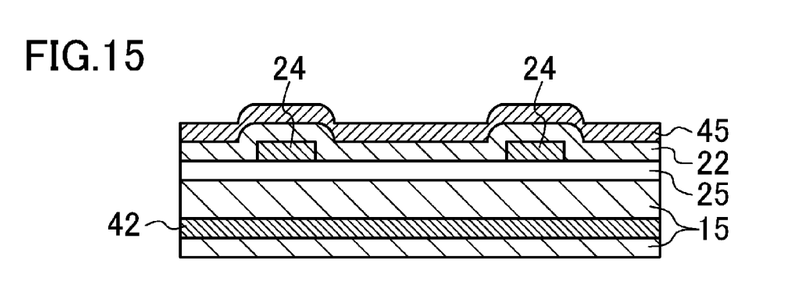
FIG. 15 is a cross-sectional view showing a silicon oxide film formed on the second insulating film according to the second embodiment.

FIG. 12 is a cross-sectional view showing a base layer 15 having a delamination layer 42. FIG. 13 is a cross-sectional view showing the base layer 15 having light-shielding films 24. FIG. 14 is a cross-sectional view showing the base layer 15 having a second insulating film 22 covering the light-shielding films 24. FIG. 15 is a cross-sectional view showing a silicon oxide film 45 formed on the second insulating film 22.

Figure 16:
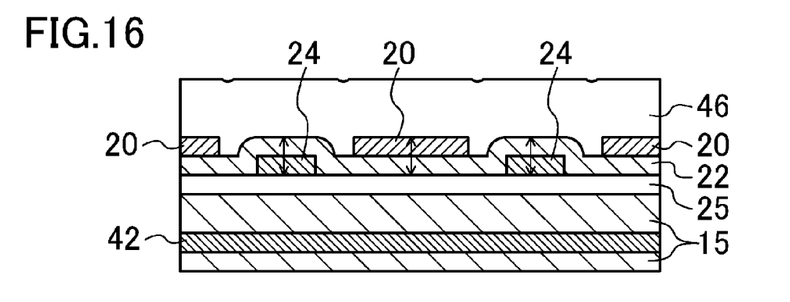
FIG. 16 is a cross-sectional view showing an insulating material layer covering dummy patterns according to the second embodiment.
Figure 17:
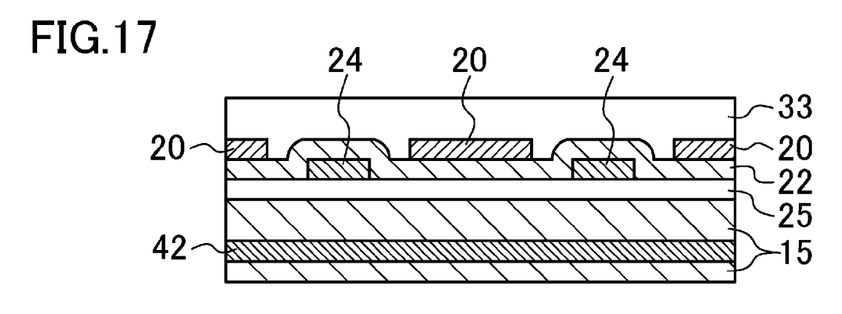
FIG. 17 is a cross-sectional view showing the base layer having a third insulating film according to the second embodiment.
Figure 18:
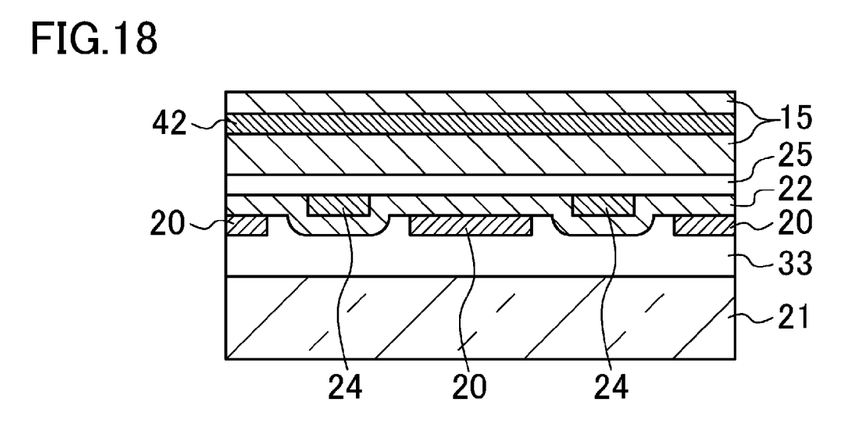
FIG. 18 is a cross-sectional view showing the base layer bonded to a glass substrate.
Figure 19:
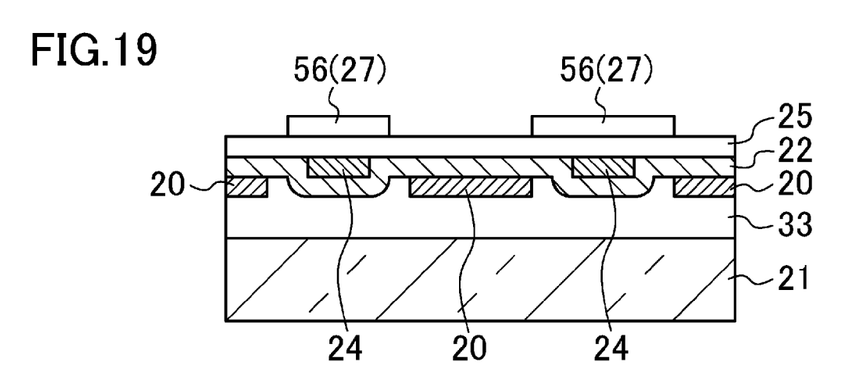
FIG. 19 is a cross-sectional view showing the base layer having semiconductor layers according to the second embodiment.

FIG. 16 is a cross-sectional view showing an insulating material layer 46 covering dummy patterns 20. FIG. 17 is a cross-sectional view showing the base layer 15 having a third insulating film 33. FIG. 18 is a cross-sectional view showing the base layer 15 bonded to a glass substrate 21. FIG. 19 is a cross-sectional view showing the base layer 15 having semiconductor layers 27.

(First Insulating Film Formation Step)

First, as shown in FIG. 12, a first insulating film 25 is formed on the surface of a silicon wafer 15 as a base layer 15. Since the base layer 15 has a flat surface, the first insulating film 25 is also formed with a flat surface.

(Delamination Layer Formation Step)

Then, as shown in FIG. 12, a delamination material 41 is ion implanted into the base layer 15 having the first insulating film 25 thereon, thereby forming a delaminating layer 42. As in the first embodiment, hydrogen or an inert element (He, Ne, etc.) is used as the delamination material 41. Since the first insulating film 25 has a flat surface, the delamination layer 42 can be formed at a substantially constant depth inside the base layer 15.

(Light-Shielding Film Formation Step)

Thereafter, as shown in FIG. 13, light-shielding films 24 are formed on the surface of the first insulating film 25. Specifically, for example, a refractory metal layer such as Mo, TiN, or W is formed on the surface of the first insulating film 25, and then the refractory metal layer is etched by photolithography to form the light-shielding films 24.

(Second Insulating Film Formation Step)

Subsequently, as shown in FIG. 14, a second insulating film 22 having an uneven surface reflecting the stepped shape of the light-shielding films 24 is formed over the surface of the first insulating film 25 so as to cover the light-shielding films 24. The second insulating film 22 is, e.g., a dense protective insulating film such as a silicon nitride film.

(Dummy Pattern Formation Step)

Then, as shown in FIG. 16, a dummy pattern 20 is formed on the surface of the second insulating film 22 between adjoining ones of the light-shielding films 24. Specifically, as shown in FIG. 15, a silicon oxide film 45 as an insulating film is first formed on the entire surface of the second insulating film 22. The thickness of the silicon oxide film 45 is about the same as that of the light-shielding films 45. Thereafter, the silicon oxide film 45 formed on the surface of the second insulating film 22 is etched by using the second insulating film 22 as an etch stopper, thereby forming the dummy patterns 20 as shown in FIG. 16.

(Third Insulating Film Formation Step)

Thereafter, as shown in FIG. 16, an insulating material layer 46 is first formed over the surface of the second insulating film 22. Then, as shown in FIG. 17, the surface of the insulating material layer 46 is polished and planarized by a CMP method etc. to form a third insulating film 33.

(Bonding Step)

Subsequently, as shown in FIG. 18, the base layer 15 provided with the light-shielding films 24 is bonded to a glass substrate 21 so that the flat surface of the third insulating film 33 faces the glass substrate 21. At this time, the surface of the third insulating film 33 is bonded to the surface of the glass substrate 21 by self-bonding due to the van der Waals force.

(Separating Step)

Thereafter, a part of the base layer 15 bonded to the glass substrate 21 is separated and removed along the delamination layer 42 by heating the base layer 15 to about 400-600° C.

(Semiconductor Layer Formation Step)

Then, as shown in FIG. 19, the base layer 15 remaining over the glass substrate 21 is etched to form protruding regions 56 as semiconductor layers 27. The protruding regions 56 are formed so that each protruding region 56 overlaps at least a part of a corresponding one of the light-shielding films 24. The protruding regions 56 are formed in an island shape as shown in FIG. 19.

(Gate Insulating Film Formation Step)

Thereafter, as shown in FIG. 11, a gate insulating film 28 is formed so as to cover the semiconductor layers 27. The gate insulating film 28 is formed to have a convex surface along the surfaces of the semiconductor layers 27.

(Gate Electrode Formation Step)

Then, as shown in FIG. 11, gate electrodes 29 are formed on the surface of the gate insulating film 28 so as to overlap channel regions 51 of the semiconductor layers 27.

(Heavily Doped Impurity Region Formation Step)

Subsequently, as shown in FIG. 11, the semiconductor layers 27 are doped with an impurity element by using the gate electrodes 29 as a mask. Thus, a heavily doped impurity region 52 is formed in a region of each semiconductor layer 27, which does not overlap a corresponding one of the gate electrodes 29, whereas the channel region 51 is formed in a region of each semiconductor layer 27, which overlaps a corresponding one of the gate electrodes 29.

Thereafter, as in the first embodiment, contact holes 31 are formed in an interlayer insulating film 30 etc., and a plurality of interconnect portions 32 are formed. The semiconductor device 1 is manufactured by the steps described above.

Advantages of Second Embodiment

According to the second embodiment, as in the first embodiment, no CMP treatment need be performed on the large-size glass substrate 21, and the third insulating film 33 covering the light-shielding films 24 can be planarized with high accuracy over the base layer 15 by a CMP method regardless of the shape of the light-shielding films 24.

Moreover, since the protruding regions 56 are not formed in advance in the base layer 15 before forming the first insulating film 25, hydrogen can be ion implanted into the base layer 15 via the base layer 15 and the first insulating film 25 both having a flat surface. This allows the delamination layer 42 to be formed at a more uniform depth position in the base layer 15.

In addition, since the first insulating film 25 need not be subjected to a planarizing treatment, the total number of times the planarizing step is performed by using a CMP method can be reduced to one, which is performed when forming the third insulating film 33.

<Third Embodiment>

Figure 20:
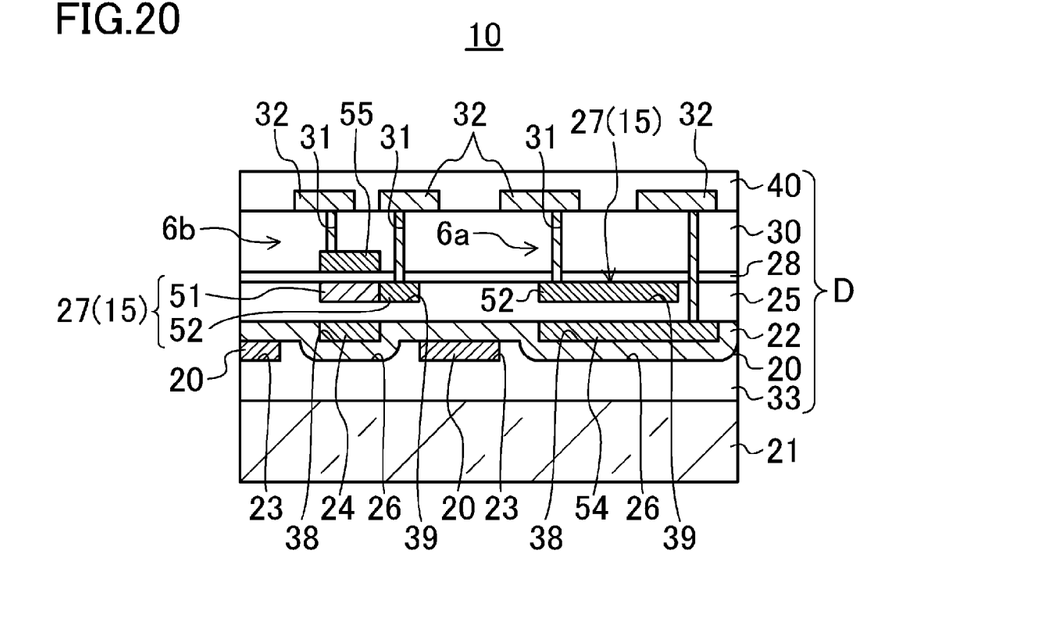
FIG. 20 is a cross-sectional view showing a main part of a semiconductor device according to a third embodiment.

FIG. 20 shows a third embodiment of the present invention.

Figure 21:
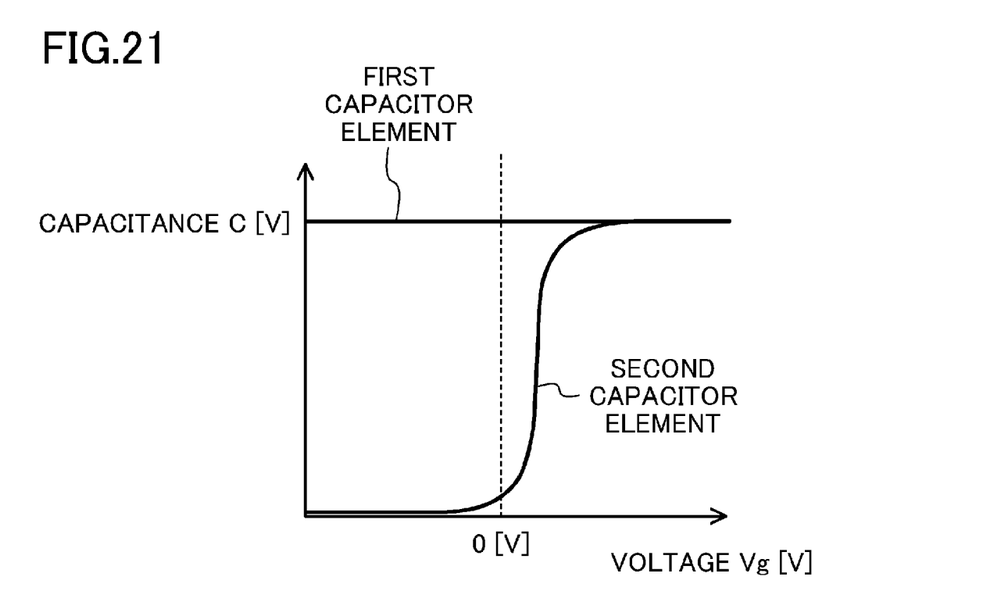
FIG. 21 is a graph showing the voltage-capacitance relation in a first capacitor element and a second capacitor element according to the third embodiment.

FIG. 20 is a cross-sectional view showing a main part of a semiconductor device 10 according to the third embodiment. FIG. 21 is a graph showing the voltage-capacitance relation in a first capacitor element 6a and a second capacitor element 6b.

Configuration of Semiconductor Device

Although the semiconductor elements included in the semiconductor devices 10 of the first and second embodiments are the TFTs 5, at least one of semiconductor elements included in the semiconductor device 10 of the third embodiment is a capacitor element 6a, 6b.

The semiconductor device 10 of the present embodiment includes a glass substrate 21 as a support substrate, and a high-density element portion D formed with high accuracy on the glass substrate 21. The element portion D includes a first capacitor element 6a and a second capacitor element 6b.

As shown in FIG. 20, the first capacitor element 6a has a back gate electrode 54 as one capacitor electrode, and a semiconductor layer 27 (a heavily doped impurity region 52) doped with an N+ type impurity element and placed as the other capacitor electrode so as to face the back gate electrode 54.

The second capacitor element 6b has a semiconductor layer 27 (a channel region 51 and a heavily doped impurity region 52) as one capacitor electrode, and an electrode layer 55 placed as the other capacitor electrode so as to face the semiconductor layer 27.

Specifically, a plurality of first recesses 23 and a plurality of second recesses 26 are alternately formed in a flat substrate of the glass substrate 21. A dummy pattern 20, which is comprised of, e.g., a silicon oxide film etc., is provided in each of the first recesses 23. A second insulating film 22 is formed over the surface of a third insulating film 33 so as to cover the dummy patterns 20. That is, a part of the second insulating film 22 is provided in the second recesses 26.

The second insulating film 22 has a substantially constant thickness. Since the second insulating film 22 is formed along the second recesses 26, third recesses 38 are formed in those regions of the second insulating film 22 which overlap the second recesses 26, respectively. The second insulating film 22 is comprised of, e.g., a dense insulating film such as a silicon nitride film.

Thus, in the third embodiment as well, the total thickness of the dummy pattern 20 and the second insulating film 22 overlapping the dummy pattern 20 is equal to that of a light-shielding film 24 and the second insulating film 22 overlapping the light-shielding film 24, as in the first and second embodiments.

The back gate electrode 54 or the light-shielding film 24 is provided in each of the third recesses 38. The respective surfaces of the back gate electrode 54 and the light-shielding film 24 are flush with the surface of the second insulating film 22. The back gate electrode 54 and the light-shielding film 24 are comprised of, e.g., a refractory metal such as Mo, TiN, or W.

A first insulating film 25 is formed over the surface of the second insulating film 22 so as to cover the back gate electrode 54 and the light-shielding film 24. Fourth recesses 39 are formed in the opposite surface of the first insulating film 25 from the second insulating film 22 in those regions which overlap either at least a part of the back gate electrode 54 or at least a part of the light-shielding film 24. At least a part of each semiconductor layer 27 overlaps the back gate electrode 54 or the light-shielding film 24.

The semiconductor layers 27 are formed in the fourth recesses 39, and the surfaces of the semiconductor layers 27 are flush with the opposite surface of the first insulating film 25 from the second insulating film 22. Thus, the semiconductor layers 27 are formed in an island shape in the surface of the first insulating film 25.

The heavily doped impurity region 52 forming the first capacitor element 6a is provided in the fourth recess 39 facing the back gate electrode 54. On the other hand, the channel region 51 and the heavily doped impurity region 52, which form the second capacitor element 6b, are provided in the fourth recess 39 facing the light-shielding film 24.

A part of the base layer 15 has been separated and removed along a delamination layer 42 formed by ion implantation of a delamination material such as hydrogen. Thus, the base layer 15 has been reduced in thickness by separating and removing the part of the base layer 15 by a heat treatment.

The surfaces of the semiconductor layers 27 and the surface of the first insulating film 25 are directly covered by a gate insulating film 28. The electrode layer 55 is formed on the surface of the gate insulating film 28 so as to overlap the channel region 51 of the semiconductor layer 27 that forms the second capacitor element 6b.

An interlayer insulating film 30 is formed over the gate insulating film 28 so as to cover the electrode layer 55. Contact holes 31 are formed so as to extend through the interlayer insulating film 30 at positions on the electrode layer 55, the back gate electrode 54, and the heavily doped impurity regions 52. Moreover, interconnect portions 32 are formed on the surface of the interlayer insulating film 30 and inside the contact holes 31. A protective film 40 is formed over the surface of the interlayer insulating film 30 so as to cover the interconnect portions 32.

Manufacturing Method

The semiconductor device 10 of the present embodiment can be manufactured in a manner similar to that of the first embodiment. At least one of the semiconductor elements, a semiconductor layer (a heavily doped impurity region 52) doped with an impurity element and a back gate element 54 are formed so as to face each other, thereby forming a capacitor element 6a having the heavily doped impurity region 52 and the back gate electrode 54 as a pair of capacitor electrodes.

Specifically, the protruding region formation step, the first insulating film formation step, and the delamination layer formation step are sequentially performed as in the first embodiment. Then, in the light-shielding film formation step, the light-shielding film 24 and the back gate electrode 54 are formed at the same time. Like the light-shielding film 24, the back gate electrode 54 is also formed by patterning a refractory metal layer by photolithography and etching.

Thereafter, the second insulating film formation step, the dummy pattern formation step, the third insulating film formation step, the bonding step, the separating step, the semiconductor layer formation step, and the gate insulating film formation step are sequentially performed. In the semiconductor layer formation step, semiconductor layers 27 are formed which serve as capacitor electrodes of a first capacitor element 6 and a second capacitor element 6b.

Then, in the electrode layer formation step, an electrode layer 55 is formed so as to overlap the channel region 51, as in the gate electrode formation step.

Subsequently, the heavily doped impurity region formation step is performed, in which at least a part of each semiconductor layer 27 is doped with an impurity element to form heavily doped impurity regions 52. Then, contact holes 31 are formed in the interlayer insulating film 30 etc. Thereafter, a metal layer formed on the interlayer insulating film 30 is patterned by photolithography to form a plurality of interconnect portions 32. The semiconductor device 10 is manufactured by the steps described above.

According to the third embodiment, as in the first embodiment, no CMP treatment need be performed on the large-size glass substrate 21, and the third insulating film 33 covering both the back gate electrode 54 and the light-shielding film 24 can be planarized with high accuracy over the base layer 15 by a CMP method regardless of the shapes of the back gate electrode 54 and the light-shielding film 24.

Moreover, since the light-shielding film 24 overlapping the channel region 51 of the semiconductor layer 27 is provided for the second capacitor element 6b, light incidence on the channel region 51 can be blocked, and the possibility of malfunctions can be reduced.

As shown in FIG. 21, in the second capacitor element 6b, one of the capacitor electrodes is comprised of the channel region 51 of the semiconductor layer 27. Thus, capacitance C is produced by an applied voltage higher than the threshold voltage. On the other hand, in the first capacitor element 6a, one of the capacitor electrodes is comprised of the heavily doped impurity region 52 as the entire semiconductor layer 27. Thus, capacitance C is constant regardless of the applied voltage. That is, the first capacitor element 6a can be used as a capacitor element that is stable in a wide applied-voltage range.

<Other Embodiments>

The first to third embodiments are described with respect to an example in which the semiconductor device 10 is used as various functional circuits such as a driver formed directly on the glass substrate 21. However, the present invention is not limited to this. For example, the semiconductor device 10 can be similarly used as a semiconductor device having TFTs that are formed at each pixel to drive pixel electrodes.

The present invention is similarly applicable to semiconductor devices for use in, e.g., display devices other than LCD devices, such as organic electroluminescent (EL) display devices.

INDUSTRIAL APPLICABILITY

As described above, the present invention is useful for semiconductor devices for use in, e.g., LCD devices, and manufacturing methods thereof.

DESCRIPTION OF REFERENCE CHARACTERS

1 LCD device
5 TFT (Semiconductor Element)
6a First Capacitor Element
6b Second Capacitor Element
10 Semiconductor Device
15 Base Layer
16 Protruding Region
20 Dummy Pattern
21 Glass Substrate, Support Substrate
22 Second Insulating Film (Protective Insulating Film)
23 First Recess
24 Light-Shielding Film
25 First Insulating Film
26 Second Recess
27 Semiconductor Layer
33 Third Insulating Film
38 Third Recess
41 Delamination Material
42 Delamination Layer
46 Insulating Material Layer
51 Channel Region
52 Heavily Doped Impurity Region
54 Back Gate Electrode
56 Protruding Region

The invention claimed is:

1. A method for manufacturing a semiconductor device, comprising the steps of:
    forming on a surface of a base layer a first insulating film having a flat surface;
    ion implanting a delamination material into the base layer to form a delamination layer;
    forming a plurality of light-shielding films or back gate electrodes on the surface of the first insulating film;
    forming over the surface of the first insulating film a second insulating film that covers the light-shielding films or the back gate electrodes and that has an uneven surface reflecting a stepped shape of the light-shielding films or the back gate electrodes;
    forming a dummy pattern on the surface of the second insulating film between adjoining ones of the light-shielding films or between adjoining ones of the back gate electrodes, so that a height of the dummy pattern is equal to that of the second insulating film on the light-shielding films or the back gate electrodes, as measured from the surface of the first insulating film;
    forming over the surface of the second insulating film a third insulating film that covers the dummy pattern and that has a flat surface;
    bonding the base layer provided with the third insulating film to a support substrate so that the flat surface of the third insulating film faces the support substrate;
    separating and removing along the delamination layer a part of the base layer bonded to the support substrate; and
    forming, from the base layer remaining over the support substrate, a plurality of semiconductor layers forming semiconductor elements, so that at least a part of the semiconductor layer overlaps the light-shielding film or the back gate electrode.

2. The method of claim 1, wherein
    the second insulating film is comprised of a protective insulating film that suppresses passage of metal ions therethrough.

3. The method of claim 2, wherein
    the protective insulating film is a silicon nitride film.

4. The method of claim 1, wherein
    in the step of forming the third insulating film, the third insulating film is formed by forming an insulating material layer over the surface of the second insulating film, and then planarizing a surface of the insulating material layer, and
    an interval between the light-shielding film or the back gate electrode and the dummy pattern is larger than a thickness of the second insulating film, and is smaller than a thickness of the insulating material layer over the light-shielding film or the back gate electrode.

5. The method of claim 1, further comprising the step of:
    forming protruding regions as the semiconductor layers by etching the surface of the base layer, wherein
    the step of forming the protruding regions is performed before the step of forming the first insulating film, and
    in the step of forming the light-shielding films or the back gate electrodes, the light-shielding films or the back gate electrodes are formed so that the light-shielding film or the back gate electrode overlaps at least a part of the protruding region.

6. The method according to claim 1, further comprising the step of:
    forming protruding regions as the semiconductor regions by etching the base layer remaining over the support substrate, so that the protruding region overlaps at least a part of the light-shielding film or the back gate electrode, wherein
    the step of forming the protruding regions is performed after the step of separating and removing the part of the base layer.

7. The method according to claim 1, wherein
    the step of forming the delamination layer is performed before the step of forming the light-shielding films or the back gate electrodes.

8. The method according to claim 1, wherein
    in the step of forming the dummy pattern, the dummy pattern is formed by etching an insulating film formed on the surface of the second insulating film, by using the second insulating film as an etch stopper.

9. The method according to claim 1, wherein
    the back gate electrodes are formed in the step of forming the light-shielding films or the back gate electrodes, the method further comprising the step of:
    doping the semiconductor layers with an impurity element, wherein
    as at least one of the semiconductor elements, a capacitor element having both the semiconductor layer and the back gate electrode as a pair of capacitor electrodes is formed by forming the semiconductor layer doped with the impurity element and the back gate electrode so that the semiconductor layer faces the back gate electrode.

* * * * *